(12) United States Patent
Son et al.

(10) Patent No.: US 10,578,916 B2
(45) Date of Patent: Mar. 3, 2020

(54) BACKLIGHT UNIT, DISPLAY DEVICE AND METHOD FOR MANUFACTURING DISPLAY DEVICE

(71) Applicant: Samsung Display Co. Ltd., Yongin-si, Gyeonggi-do (KR)

(72) Inventors: Young Hye Son, Yongin-si (KR); Eui Jeong Kang, Suwon-si (KR); Yong Hoon Kwon, Hwaseong-si (KR); Won Jin Kim, Hwaseong-si (KR); Jung Hyun Kim, Suwon-si (KR); Woo Suk Seo, Yongin-si (KR); Si Joon Song, Suwon-si (KR); Sang Woo Ha, Suwon-si (KR)

(73) Assignee: SAMSUNG DISPLAY CO. LTD., Gyeonggi-Do (KR)

(*) Notice: Subject to any disclaimer, the term of this patent is extended or adjusted under 35 U.S.C. 154(b) by 0 days.

(21) Appl. No.: 16/100,293

(22) Filed: Aug. 10, 2018

(65) Prior Publication Data

US 2019/0094613 A1 Mar. 28, 2019

(30) Foreign Application Priority Data

Sep. 26, 2017 (KR) .................. 10-2017-0123963

(51) Int. Cl.
*G02F 1/1335* (2006.01)
*F21V 8/00* (2006.01)
(Continued)

(52) U.S. Cl.
CPC ..... *G02F 1/133603* (2013.01); *G02B 6/0023* (2013.01); *G02B 6/0026* (2013.01);
(Continued)

(58) Field of Classification Search
CPC .. G02B 6/0026; G02B 6/0073; G02B 6/0065; G02F 1/133514; G02F 1/133603;
(Continued)

(56) References Cited

U.S. PATENT DOCUMENTS 9,074,748 B2 * 7/2015 Yang .................. G02B 6/42
9,341,763 B1 * 5/2016 Fan .................. G02B 6/0026
(Continued)

FOREIGN PATENT DOCUMENTS

KR 1020110044002 A 4/2011
KR 1020120112215 A 10/2012
(Continued)

*Primary Examiner* — Peggy A Neils
(74) *Attorney, Agent, or Firm* — Cantor Colburn LLP

(57) ABSTRACT

A backlight unit includes: a light guide plate through which light is provided to a display panel which displays an image with the light; a light source which emits the light to the light guide plate, the light source disposed facing a light incident side surface of the light guide plate; and a wavelength-converting film through which emitted light from the light source is wavelength-converted and provided to the light incident side surface of the light guide plate. The wavelength-converting film includes: a first end portion thereof connected to the light guide plate, a central portion thereof disposed between the light source and the light incident side surface of the light guide plate, and glass in which wavelength-converting particles are dispersed.

20 Claims, 17 Drawing Sheets

(51) Int. Cl.
  *H01L 33/50* (2010.01)
  *G02F 1/017* (2006.01)
(52) U.S. Cl.
  CPC .. *G02F 1/133514* (2013.01); *G02F 1/133615* (2013.01); *H01L 33/502* (2013.01); *G02F 2001/01791* (2013.01); *G02F 2001/133614* (2013.01); *G02F 2202/36* (2013.01)
(58) Field of Classification Search
  CPC ..... G02F 2001/01791; G02F 1/133615; H01L 33/502; F21V 9/30; C23C 14/5813
  See application file for complete search history.

(56) References Cited

U.S. PATENT DOCUMENTS

| | | | |
|---|---|---|---|
| 9,568,664 B2* | 2/2017 | Cho | G02B 6/0065 |
| 2006/0077686 A1* | 4/2006 | Han | G02B 6/0028 |
| | | | 362/610 |
| 2008/0025045 A1* | 1/2008 | Mii | G02B 6/0026 |
| | | | 362/611 |
| 2016/0209572 A1* | 7/2016 | Cho | G02B 6/0026 |
| 2017/0179359 A1* | 6/2017 | Lunz | F21V 29/70 |

FOREIGN PATENT DOCUMENTS

| | | |
|---|---|---|
| KR | 1020160135891 A | 11/2016 |
| KR | 1020160137930 A | 12/2016 |
| KR | 1020170051639 A | 5/2017 |

* cited by examiner

BACKLIGHT UNIT, DISPLAY DEVICE AND METHOD FOR MANUFACTURING DISPLAY DEVICE

This application claims priority to Korean Patent Application No. 10-2017-0123963 filed on Sep. 26, 2017, and all the benefits accruing therefrom under 35 U.S.C. § 119, the content of which in its entirety is herein incorporated by reference.

BACKGROUND

1. Field

The present disclosure relates to a backlight unit, a display device and a method for manufacturing a display device.

2. Description of the Related Art

Liquid-crystal display devices occupy a very large portion of display devices used in information display technology. A liquid crystal display device includes two glass substrates and a liquid-crystal layer sandwiched therebetween. An electrode is formed on each glass substrate. A voltage is applied to adjust the orientation of the liquid crystals to display information by adjusting the light transmittance.

Such liquid-crystal display devices are light-receiving devices that are not self-emitting but display images by adjusting the transmittance of light coming from outside thereof. Accordingly, liquid-crystal display devices require a separate device for irradiating light to the display panel, i.e., a backlight unit.

A light-emitting diode ("LED") has been spotlighted as a light source of a backlight unit for a liquid crystal display device. An LED is a semiconductor light-emitting device that emits light when electric current flows therethrough. LEDs are widely employed within lighting devices, electronic display boards and backlight units for display devices since they have relatively long lifetime, low power consumption, fast response speed and excellent initial driving characteristics. More and more applications are using the LEDs.

When LEDs are used as a light source, quantum dots are used to increase the purity of the color generated and emitted thereby. The quantum dots emit light as excited electrons transfer from the conduction band to the valence band. Quantum dots exhibit characteristics that wavelength emitted by use of a given material differs depending on the size of particles within the material. As the size of the quantum dots decreases, the emitted light has a shorter wavelength. Therefore, the light of a desired wavelength range can be obtained by adjusting the size of the particles within the material of the LEDs.

SUMMARY

One or more embodiment of the present disclosure provides a backlight unit providing white light efficiently.

One or more embodiment of the present disclosure also provides a display device reducing the area occupied by the backlight unit.

These and other features, embodiments and advantages of the present disclosure will become immediately apparent to those of ordinary skill in the art upon review of the Detailed Description and Claims to follow.

According to an embodiment of the present disclosure, there is provided a backlight unit including: a light guide plate through which light is provided to a display panel which displays an image with the light; a light source which emits the light to the light guide plate, the light source disposed facing a light incident side surface of the light guide plate; and a wavelength-converting film through which emitted light from the light source is wavelength-converted and provided to the light incident side surface of the light guide plate. The wavelength-converting film includes: a first end portion thereof connected to the light guide plate, a central portion thereof disposed between the light source and the light incident side surface of the light guide plate; and a glass in which wavelength-converting particles are dispersed.

The wavelength-converting film may include a flexible glass film, and the wavelength-converting particles may be dispersed in the flexible glass film.

The thickness of the flexible glass film may range from about 0.1 millimeter (mm) to about 0.5 mm.

The backlight unit may further include a first air gap disposed between the central portion and the light source.

The width of the first air gap may range from about 0.1 mm to about 0.2 mm.

The wavelength-converting film may further include a second end portion thereof opposing the first end portion thereof.

The second end portion may be connected to the light source.

The light source may include a printed circuit board, and the second end portion may be bonded to the printed circuit board.

The first end portion may be connected to a lower surface of the light guide plate, and the second end portion may be connected to an upper surface of the light guide plate.

The wavelength-converting particles may include a quantum dot material.

The wavelength-converting film may include a flexible glass film and a base glass which is disposed on the flexible glass film, and the wavelength-converting particles may be dispersed in the base glass.

The wavelength-converting film and the light guide plate may be laser-bonded to each other by a first laser-bonding portion between the wavelength-converting film and the light guide plate.

According to another embodiment of the present disclosure, there is provided a display device including: a display panel which displays an image with light; and a backlight unit which provides the light to the display panel. The backlight unit includes: a light guide plate through which the light is provided to the display panel; a light source which emits the light to the light guide plate, the light source disposed facing a light incident side surface of the light guide plate; and a wavelength-converting film through which emitted light from the light source is wavelength-converted and provided to the light incident side surface of the light guide plate. The wavelength-converting film includes: a first end portion thereof connected to the light guide plate, a central portion thereof disposed between the light source and the light incident side surface of the light guide plate; and glass in which wavelength-converting particles are dispersed.

The wavelength-converting film may include a flexible glass film, and the wavelength-converting particles may be dispersed in the flexible glass film.

The display device may further include a first air gap disposed between the central portion and the light source.

The wavelength-converting particles may include a quantum dot material.

The wavelength-converting film may include a flexible glass film and a base glass which is disposed on the flexible glass film, the base glass may be disposed between the flexible glass film and the light incident surface of the light guide plate, and the wavelength-converting particles may be dispersed in the base glass.

The wavelength-converting film and the light guide plate may be laser-bonded to each other by a first laser-bonding portion between the wavelength-converting film and the light guide plate.

According to another embodiment of the present disclosure, there is provided a method for manufacturing a display device, the method including: combining glass frit with wavelength-converting particles to form a combination of glass frit and wavelength-converting particles; disposing the combination of glass frit and wavelength-converting particles into a mold in which the combination of glass frit and wavelength-converting particles is sintered; separating a portion of the sintered combination into a wavelength-converting film of a backlight unit of the display device; connecting a first end portion of the wavelength-converting film to a light guide plate of the backlight unit, where the light guide plate guides light therethrough to a display panel of the display device which displays an image with the light; and disposing a portion of the wavelength-converting film which includes the wavelength-converting particles and is adjacent to the first end portion thereof, between the light guide plate and a light source of the backlight unit, where the light source emits the light to a light incident surface of the light guide plate.

Particulars in the exemplary embodiments of the present disclosure will be described in the detail description with reference to the accompanying drawings.

According to exemplary embodiments of the present disclosure, it is possible to provide a backlight unit providing white light efficiently.

Further, the area occupied by the backlight unit can be reduced.

It should be noted that effects of the present disclosure are not limited to those described above and other effects of the present disclosure will be apparent to those skilled in the art from the following descriptions.

BRIEF DESCRIPTION OF THE DRAWINGS

The above and other features of the present disclosure will become more apparent by describing in detail exemplary embodiments thereof with reference to the attached drawings, in which.

DETAILED DESCRIPTION

Figure 1:
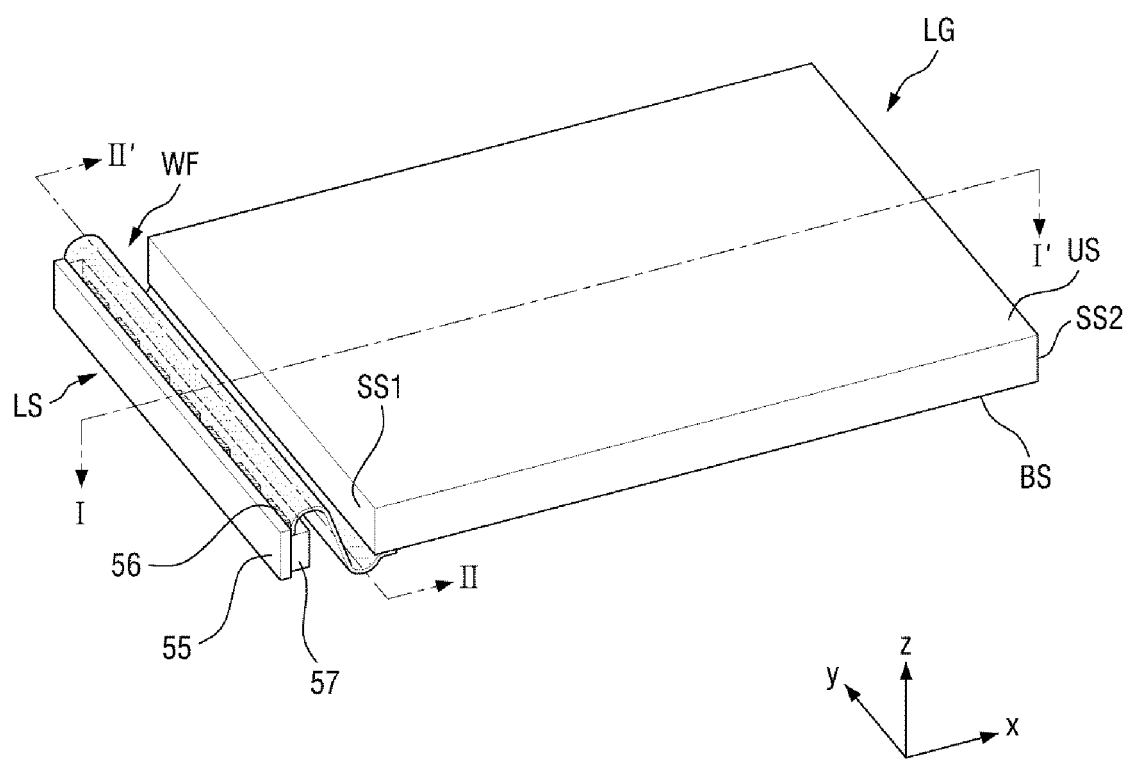
FIG. 1 is a perspective view of an exemplary embodiment of a backlight unit according to the invention.

The advantages and features of the invention and methods for achieving the advantages and features will be apparent by referring to the embodiments to be described in detail with reference to the accompanying drawings. However, the invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the invention is only defined within the scope of the appended claims.

Description of an element as being related to another element such as being "on" another element or "located on" a different layer or a layer, includes both a case where an element is located directly on another element or a layer and a case where an element is located on another element via another layer or still another element. In contrast, description of an element as being related to another element such as being "directly on" another element or "located directly on" a different layer or a layer, indicates a case where an element is located on another element or a layer with no intervening element or layer therebetween. In the entire description of the invention, the same drawing reference numerals are used for the same elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the present disclosure will be described with reference to the accompanying drawings.

Figure 2:
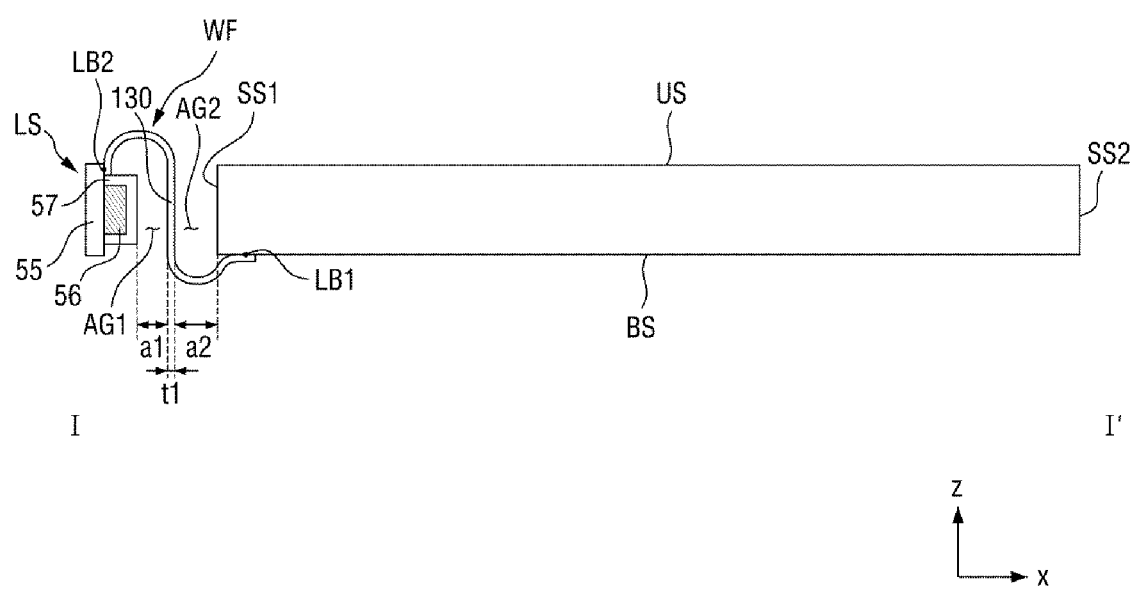
FIG. 2 is a cross-sectional view taken along line I-I' of FIG. 1.
Figure 3:
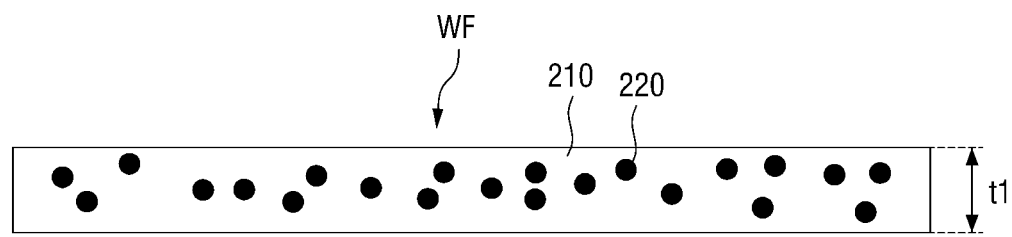
FIG. 3 is a cross-sectional view taken along line II-II' of FIG. 1.
Figure 4:
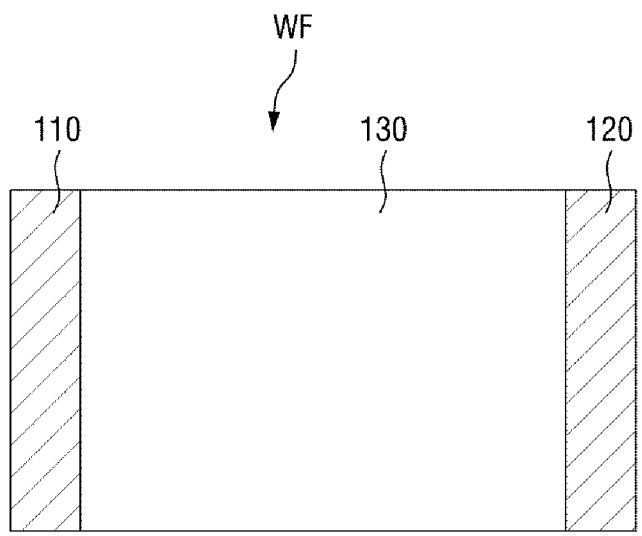
FIG. 4 is a top plan view of an exemplary embodiment of a wavelength-converting film of the backlight unit of FIG. 1.
Figure 5:
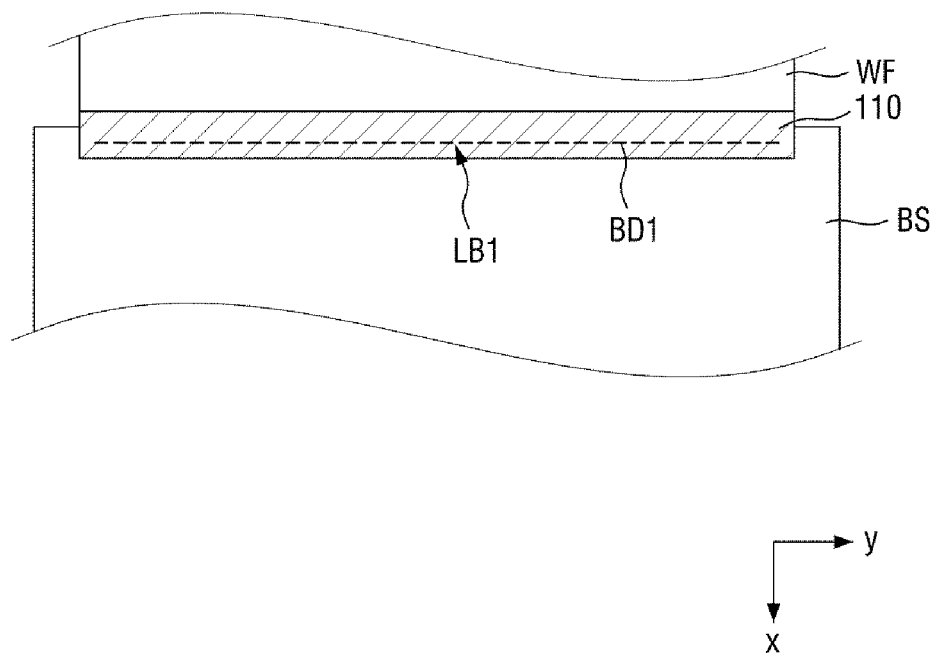
FIG. 5 is a top plan view of an exemplary embodiment of a wavelength-converting film relative to a light guide plate of a backlight unit shown in FIG. 1.
Figure 6:
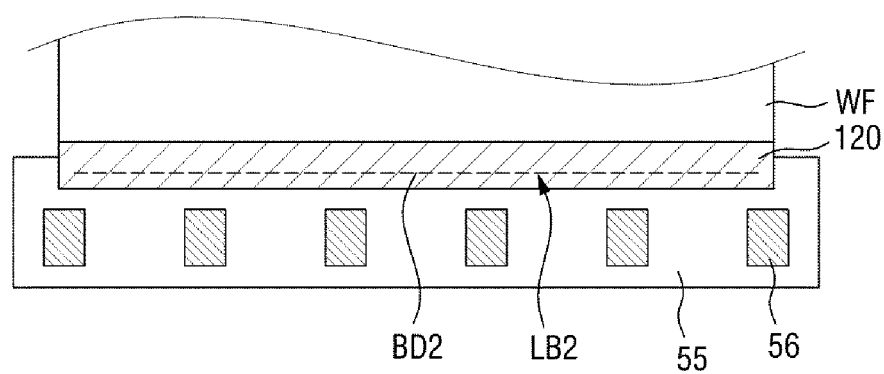
FIG. 6 is a top plan view of an exemplary embodiment of a wavelength-converting film relative to a light source of the backlight unit shown in FIG. 1.
Figure 7:
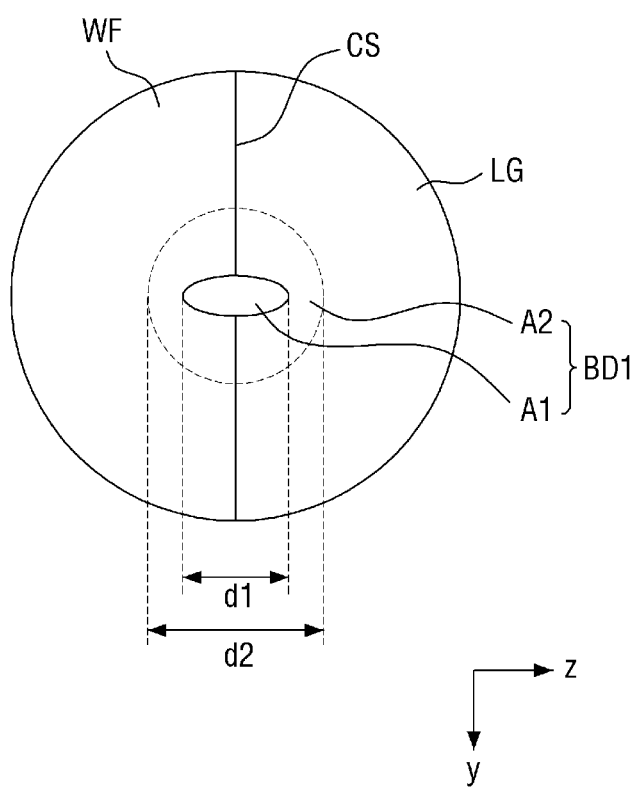
FIG. 7 is an enlarged cross-sectional view of an exemplary embodiment of a bonding dot relative to a wavelength-converting film and a light guide of the backlight unit shown in FIG. 6.

FIG. 1 is a perspective view of an exemplary embodiment of a backlight unit according to the invention. FIG. 2 is a cross-sectional view taken along line I-I' of FIG. 1. FIG. 3 is a cross-sectional view taken along line II-II' of FIG. 1. FIG. 4 is a top plan view of an exemplary embodiment of a wavelength-converting film of the backlight unit of FIG. 1. FIG. 5 is a top plan view of an exemplary embodiment of a wavelength-converting film relative to a light guide plate of a backlight unit shown in FIG. 1. FIG. 6 is a top plan view of an exemplary embodiment of a wavelength-converting film relative to a light source of the backlight unit shown in FIG. 1. FIG. 7 is an enlarged cross-sectional view of an exemplary embodiment of a bonding dot relative to a wavelength-converting film and a light guide plate of the backlight unit shown in FIG. 6.

Referring to FIGS. 1 to 7, a backlight unit according to an exemplary embodiment of the present disclosure may include a light guide plate LG, a light source LS disposed on a side of the light guide plate LG, and a wavelength-converting film WF including a first connecting (end) portion 110 connected to the light guide plate LG, a second connecting (end) portion 120 connected to the light source LS and a center portion 130 between the first connecting portion 110 and the second connecting portion 120. The wavelength-converting film WF may include a glass composition or base medium in which wavelength-converting particles are dispersed.

In an exemplary embodiment, the light guide plate LG may include upper and lower surfaces US and BS opposed to each other, and first and second side surfaces SS1 and SS2 connecting the upper surface US with the lower surface BS. The light guide plate LG is disposed in plane parallel to a plane defined by first (x-axis) and second (y-axis) directions crossing each other. A thickness of the light guide plate LG and the overall backlight unit is taken in a third (z-axis) direction which crosses each of the first and second directions. The first to third directions may be orthogonal to each other, without being limited thereto. The wavelength-converting film WF may be a single unitary member.

Light generated and emitted from the light source LS may exit from the backlight unit via the upper surface US of the light guide plate LG. That is, the light guide plate LG may guide the light generated and emitted from the light source LS such that the emitted light travels toward or via the upper surface US. That is, the upper surface US may also be referred to as a light-emitting surface. The light emitting-surface may face a display panel of the display device which displays an image with light provided thereto from the backlight unit.

Although FIG. 1 depicts that the upper surface US includes a flat surface, it is to be noted that the shape of the upper surface US is not limited thereto. That is, in an exemplary embodiment, a functional pattern that performs an optical function may be disposed or formed at the upper surface US. The functional pattern may include a pattern of protrusions or recesses of the light guide plate LG.

The lower surface BS may be disposed such that it is opposed to the upper surface US. In the top plan view, the lower surface BS may have substantially the same shape as the upper surface US and may be disposed in parallel with the upper surface US.

The lower surface BS may reflect or scatter light emitted from the light source LS and traveling toward the lower surface BS within the light guide plate LG, to guide the light so that it travels toward the upper surface US.

Although FIG. 1 depicts that the lower surface BS includes a flat surface, it is to be noted that the shape of the lower surface BS is not limited thereto. In an exemplary embodiment, for example, a pattern of functional features may be disposed or formed at the lower surface BS. The pattern may perform a reflection and/or scattering function as described above, and its shape and number are not particularly limited herein.

The first side surface SS1 and the second side surface SS2 may be disposed between the upper surface US and the lower surface BS.

The first side surface SS1 and the second side surface SS2 are opposed to each other and may connect the upper surface US with the lower surface BS.

In an exemplary embodiment, the first side surface SS1 may be a light incident surface of the light guide plate LG which faces the light source LS described later. That is, the light emitted from the light source LS may pass through the first side surface SS1 to be incident into the light guide plate LG.

In an exemplary embodiment, the light guide plate LG may include or be made of glass.

The light source LS for providing light to the light guide plate LG may be disposed on one side of the light guide plate LG. As mentioned earlier, the light source LS may face the first side surface SS1 and may be spaced apart from the first side surface SS1.

In an exemplary embodiment, the light source LS may include a printed circuit board 55, a light-emitting diode 56 provided in plurality, and a cover 57 covering the light-emitting diodes 56.

In an exemplary embodiment, the printed circuit board 55 may support the light-emitting diodes 56 thereon. In other words, the light-emitting diodes 56 may be mounted on the printed circuit board 55.

The printed circuit board 55 may have a length extended in a longitudinal direction. In the example shown in FIG. 1, the printed circuit board 55 is lengthwise extended in the y-axis direction.

In an exemplary embodiment, a circuit pattern (not shown) through which signals are transmitted for controlling the light-emitting diodes 56 may be disposed or formed on the printed circuit board 55.

A plurality of light-emitting diodes 56 may be mounted on the printed circuit board 55.

In an exemplary embodiment, the light-emitting diodes 56 may generate and/or emit blue light or ultraviolet ("UV") light. It is to be understood that this is merely an example and the type of the light-emitting diodes 56 is not limited thereto.

The plurality of light-emitting diodes 56 may be disposed along a length of the printed circuit board 55, that is, in the y-axis direction. Accordingly, the light-emitting diodes 56 can evenly provide light to the first side surface SS1 of which the length thereof also extends in the y-axis direction.

The cover 57 may be disposed over the light-emitting diodes 56. The cover 57 may cover the light-emitting diodes 56 to protect them.

In an exemplary embodiment, the cover 57 may include epoxy or silicon.

The wavelength-converting film WF may be disposed between the light source LS and the light guide plate LG.

Referring to FIG. 3, the wavelength-converting film WF may include a flexible glass film 210 and a wavelength-converting particle 220 provided in plurality dispersed in the flexible glass film 210.

The wavelength-converting film WF may include a combination of glass and wavelength-converting particles. In an exemplary embodiment, the combined structure may be the flexible glass film 210 and the wavelength-converting particles 220 which are dispersed in the flexible glass film 210.

The flexible glass film 210 includes or is made of glass and may be made relatively thin so that it is flexible.

In an exemplary embodiment, the thickness t1 of the flexible glass film 210 may range from about 0.1 millimeter (mm) to about 0.5 mm. The thickness t1 may represent a total thickness of the wavelength-converting film WF. The thickness t1 may represent the maximum thickness of the flexible glass film 210 and/or the overall wavelength-converting film WF.

In an exemplary embodiment, the plurality of wavelength-converting particles 220 may be dispersed in the flexible glass film 210. The wavelength-converting particles 220 may be dispersed in the flexible glass film 210 uniformly or non-uniformly.

In an exemplary embodiment, the wavelength-converting particles 220 may include a quantum dot material and/or a phosphor material.

In an exemplary embodiment, the quantum dot material may include one selected from Si-based nanocrystals, Group II-VI compound semiconductor nanocrystals, Group III-V compound semiconductor nanocrystals, Group IV-VI compound semiconductor nanocrystals, and a combination thereof.

In an exemplary embodiment, Group II-VI compound semiconductor nanocrystals may be one selected from CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZnSTe, CdHgSeS, CdHgSeTe, CdHgSTe, HgZnSeS, HgZnSeTe and HgnSTe.

In an exemplary embodiment, Group III-V compound semiconductor nanocrystals may be one selected from GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs.

In an exemplary embodiment, Group IV-VI compound semiconductor nanocrystals may be SbTe. It is, however, to be understood that the kind of the quantum dot material is not limited thereto.

In an exemplary embodiment, the phosphor material may include at least one of sulfide-based, silicon-based and nitride-based metal elements. It is, however, to be understood that the kind of the phosphor material is not limited thereto.

Referring to FIG. 4, the wavelength-converting film WF may include a first connecting portion 110, a second connecting portion 120, and a central portion 130 disposed between the first connecting portion 110 and the second connecting portion 120 and connecting these portions to each other.

The first connecting portion 110 may be connected to the light guide plate LG.

In an exemplary embodiment, the first connecting portion 110 may be connected to the lower surface BS of the light guide plate LG.

Specifically, the first connecting portion 110 may be at least partially in contact with the lower surface BS of the light guide plate LG and may be bonded to it.

In an exemplary embodiment, the first connecting portion 110 may be laser-bonded to the lower surface BS of the light guide plate LG. In the exemplary embodiment, a first laser-bonding portion LB1 may be disposed or formed between the first connecting portion 110 of the wavelength-converting film WF and the lower surface BS of the light guide plate LG.

Referring to FIG. 5, the first laser-bonding portion LB1 may include a first bonding dot BD1 provided in plurality. The first bonding dots BD1 may be arranged in the y-axis direction.

That is, the first bonding dots BD1 may be arranged along a contact area at which the wavelength-converting film WF and the lower surface BS of the light guide plate LG are in contact with each other.

Herein, in a method of manufacturing a backlight unit, the laser-bonding portion LB1 may be formed by a femtosecond laser having a wavelength in femtosecond. It is to be understood that this is merely an example and the first connecting portion 110 may be bonded to the lower surface BS in other ways.

Referring again to FIG. 4, the second connecting portion 120 may be disposed on the opposite side to the first connecting portion 110 with respect to the central portion 130.

Referring to FIG. 6, the second connecting portion 120 may be connected to the light source LS. In an exemplary embodiment, the second connecting portion 120 may be connected to the printed circuit board 55 of the light source LS. Specifically, the second connecting portion 120 may be bonded to the printed circuit board 55.

In an exemplary embodiment, the second connecting portion 120 may be laser bonded to the printed circuit board 55, and accordingly the second laser-bonding portion LB2 may be disposed or formed between the second connecting portion 120 and the printed circuit board 55.

It is to be understood that this is merely an example and the first connecting portion 120 may be bonded to the light source LS in other ways. In other exemplary embodiment, the second connecting portion 120 may be bonded to the printed circuit board 55 by an adhesive.

FIG. 6 shows the second laser-bonding portion LB2 disposed between the second connecting portion 120 and the printed circuit board 55.

The second laser-bonding portion LB2 may include a second bonding dot BD2 provided in plurality.

The second bonding dots BD2 may be arranged in a direction (the y-axis direction in FIG. 6). That is, the second bonding dots BD2 may be arranged along a contact area at which the second connecting portion 120 and the printed circuit board 55 contact each other.

FIG. 7 is an enlarged view of an exemplary embodiment of the first bonding dot BD1 relative to the wavelength-converting film WF and the light guide plate LG of the backlight unit.

Referring to FIG. 7, the first bonding dot BD1 may include a central area A1 and a peripheral area A2 which is disposed outside the central area A1.

In an exemplary embodiment, the first bonding dot BD1 may be disposed or formed across a contact surface (area) CS at which the wavelength-converting film WF and the lower surface BS of the light guide plate LG are in contact with each other. The contact surface CS may also be defined as an interface of the wavelength-converting film WF and the lower surface BS of the light guide plate LG. The contact surface CS may lengthwise extend in the y-axis direction. The wavelength-converting film WF and the light guide plate LG may be disposed on opposite sides of the contact surface CS in the z-axis direction. In an exemplary embodiment, the cross section of the central area A1 may have an elliptical shape whose major axis is longer than the minor axis.

Although the central area A1 has an elliptical shape in the following description, the shape of the cross section of the central area is not limited thereto. In another exemplary embodiment, the cross section of the central area A1 may have a circular shape, in which the description of the major axis below can be equally applied to the diameter of the circle.

Although FIG. 7 illustrates that the major axis of the central area A1 is perpendicular to a length of the contact surface CS, the direction of the major axis is not limited thereto. That is, the direction of the major axis may vary depending on the direction in which laser is irradiated.

In the central area A1, a boundary (e.g., interface) between the wavelength-converting film WF and the lower surface BS may disappear so as to not be visible. That is, the contact surface CS between the wavelength-converting film WF and the lower surface BS may not be clearly discriminated in the central area A1. The central area A1 may include melted portions of both the wavelength-converting film WF and the light guide plate LG.

In an exemplary embodiment, a width d1 of the major axis of the central area A1 may range from about 10 micrometers (μm) to about 20 μm.

The peripheral area A2 may be disposed outside the central area A1 to surround the central area A1. In an exemplary embodiment, the planar and/or cross-sectional shape of the central area A1 may be circular. The peripheral area A2 may include portions of both the wavelength-converting film WF and the light guide plate LG.

A portion of the wavelength-converting film WF and a portion of the lower surface BS included in the peripheral area A2 may each be at least partially melted. Even if portions of these two elements are melted, the boundary between the wavelength-converting film WF and the lower face BS is maintained in the peripheral area A2, and the contact surface CS can also be clearly identified therein. In an exemplary embodiment, a width d2 of the peripheral area A2 may range from about 70 μm to about 100 μm. The width d2 may represent a maximum dimension of the first bonding dot BD1.

If the size of the first bonding dots BD1 is relatively large, the wavelength-converting particles 220 within the wavelength-converting film WF may be damaged by heat applied to bond the wavelength-converting film WF and the light guide plate LG to each other. As long as the maximum width of the first bonding dots BD1 lies in the above range of about 70 μm to about 100 μm, damage to the wavelength-converting particles 220 within the wavelength-converting film WF may be reduced or effectively prevented.

In order to reduce the overall size (dimension) of the first bonding dot BD1, a laser having a wavelength in femtosecond may be used in manufacturing the backlight unit. By using the femtosecond laser, the wavelength-converting film WF is bonded to the lower surface BS of the light guide plate LG, such that the maximum dimension (e.g., width d2) of the first bonding dot BD1 can be maintained at about 100 μm or less. Further, by maintaining the maximum dimension as described above, damage to the wavelength-converting particles 220 by heat during bonding of the wavelength-converting film WF and the light guide plate LG to each other may be avoided.

Referring again to FIG. 4, for the wavelength-converting film WF disposed flat such as in a plane defined in the x-axis and y-axis directions, the central portion 130 may be disposed between the first connecting portion 110 and the second connecting portion 120.

Referring to FIG. 2, the central portion 130 may be disposed between the light source LS and the light guide plate LG, along the x-axis direction. That is, the light generated by the light source LS may be provided to the light guide plate LG through the center portion 130. In other words, the central portion 130 may be disposed on the optical path in which light emitted by the LED 56 travels from the light source LS to the light guide plate LG. The first connecting portion 110 and the second connecting portion 120 may be disposed outside the optical path described above. As illustrated in FIG. 2, the central portion 130 between the light source LS and the light guide plate LG is disposed in a plane defined by the y-axis and z-axis directions.

In an exemplary embodiment, the blue light emitted from the light source LS may be converted to white light by passing through the central portion 130. That is, the wavelength of the light emitted from the light source LS and incident to the wavelength-converting film WF may be converted by the wavelength-converting film WF to produce white light provided to the light guide plate LG.

In an exemplary embodiment, the central portion 130 between the light source LS and the light guide plate LG may be spaced apart from the light source LS and the light guide plate LG. That is, there may be an empty space between the central portion 130 and the light source LS and between the central portion 130 and the light guide plate LG, along the x-axis direction. In the following description, the empty space between the central portion 130 and the light guide LS is referred to as a first air gap AG1, and the empty space between the central portion 130 and the light guide plate LG is referred to as a second air gap AG2.

In an exemplary embodiment, the width a1 in the x-axis direction of the first air gap AG1 may range from about 0.1 mm to about 0.2 mm.

The light emitted from the light source LS toward the light guide plate LG is accompanied by heat. The heat generated in the light source LS may damage the wavelength-converting film WF, especially the wavelength-converting particles 220 therein. By employing the first air gap AG1 as described above, it is possible to prevent the heat generated in the light source LS from being directly transmitted to the wavelength-converting film WF.

In an exemplary embodiment, the second air gap AG2 may be formed between the wavelength-converting film WF and the first side surface SS1.

In an exemplary embodiment, the width a2 in the x-axis direction of the second air gap AG2 may range from about 0.1 to about 0.2 mm.

The second air gap AG2 can work as a medium having a certain refractive index. That is, the light having passed through the central portion 130 of the wavelength-converting film WF may be refracted and diffused while passing through the second air gap AG2, and accordingly the light can be evenly distributed on the first side surface SS1 of the light guide plate LG.

The wavelength-converting film WF may be bent along a length thereof from the first connecting portion 110 to the second connecting portion 120. That is, the wavelength-converting film WF may be bent at a portion between the first connecting portion 110 connected to the light source LS and the second connecting portion 120 connected to the lower surface BS of the light guide plate LG, such that at least a part of the wavelength-converting film WF, especially at least a part of the central portion 130, may be disposed on the optical path described above.

Although the wavelength-converting film WF is flexible, the film may be broken if it is bent beyond a certain angle as it is inherently made of a brittle material. Thus, the wavelength-converting film WF may be bent gently with a certain curvature.

Hereinafter, a display device according to another exemplary embodiment of the present disclosure will be described. Some of elements described below may be identical to those of the display device according to the above-described exemplary embodiment of the present disclosure; and, therefore, description thereof may be omitted to avoid redundancy.

Figure 8:
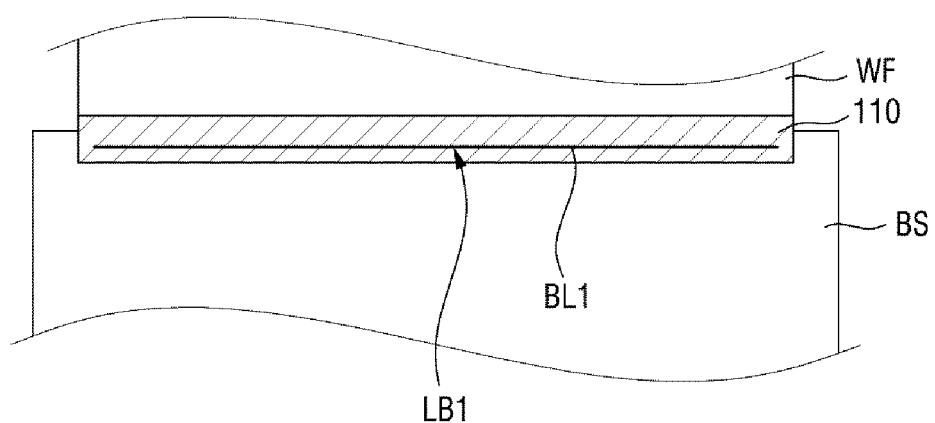
FIG. 8 is a top plan view of another exemplary embodiment of a wavelength-converting film relative to a light guide plate of a backlight unit according to the invention.

FIG. 8 is a top plan view of another exemplary embodiment of a wavelength-converting film relative to a light guide plate of a backlight unit according to the invention.

Referring to FIG. 8, the first laser-bonding portion LB1 may include a single first bonding line BL1. Unlike the discontinuous first laser-bonding portion LB1 including the discrete first bonding dots BD1 (see FIG. 5), the first laser-bonding portion LB1 in FIG. 8 may include a continuous first bonding line BL1 extending in a direction.

Although FIG. 8 illustrates only one first bonding line BL1 disposed or formed between the first connecting portion 110 of the wavelength-converting film WF and the bottom surface BS of the light guide plate LG, this is merely illustrative. In another exemplary embodiment, there may be two or more first bonding lines BL1. In such case, the plurality of first bonding lines BL1 may be arranged in parallel with one another.

By replacing the discontinuous first laser-bonding portion LB1 including the discrete first bonding dots BD1 (see FIG. 5) with the first continuous bonding line BL1 in FIG. 8, the bonding strength between the wavelength-converting film WF and the bottom surface BS of the light guide plate LG can be enhanced.

Figure 9:
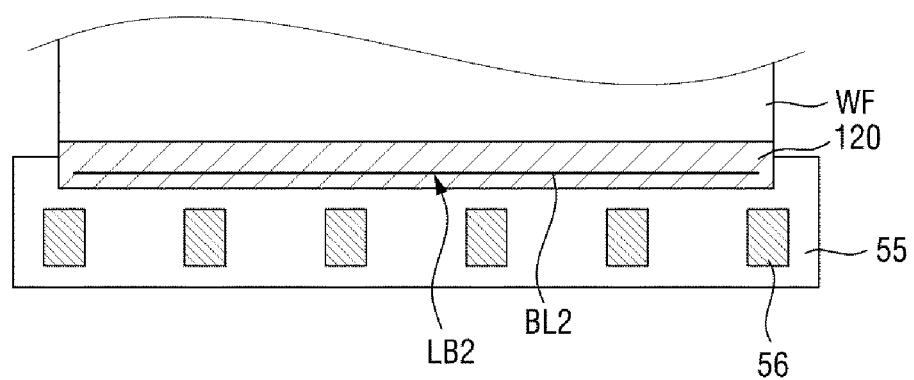
FIG. 9 is a top plan view of another exemplary embodiment of a wavelength-converting film relative to a light source of a backlight unit according to the invention.

FIG. 9 is a top plan view of another exemplary embodiment of a wavelength-converting film relative to a light source of a backlight unit according to the invention.

Referring to FIG. 9, the second laser-bonding portion LB2 may include a second bonding line BL2. Unlike the discontinuous second laser-bonding portion LB2 including the discrete second bonding dots BD2 (see FIG. 6), the second laser-bonding portion LB2 of FIG. 9 may include a continuous second bonding line BL2 extending in a direction.

Although FIG. 9 illustrates only one second bonding line BL2 formed between the second connecting portion 120 of the wavelength-converting film WF and the printed circuit board 55, this is merely illustrative. In another exemplary embodiment, there may be two or more second bonding lines BL2. In such case, the plurality of second bonding lines BL2 may be arranged in parallel with one another.

Figure 10:
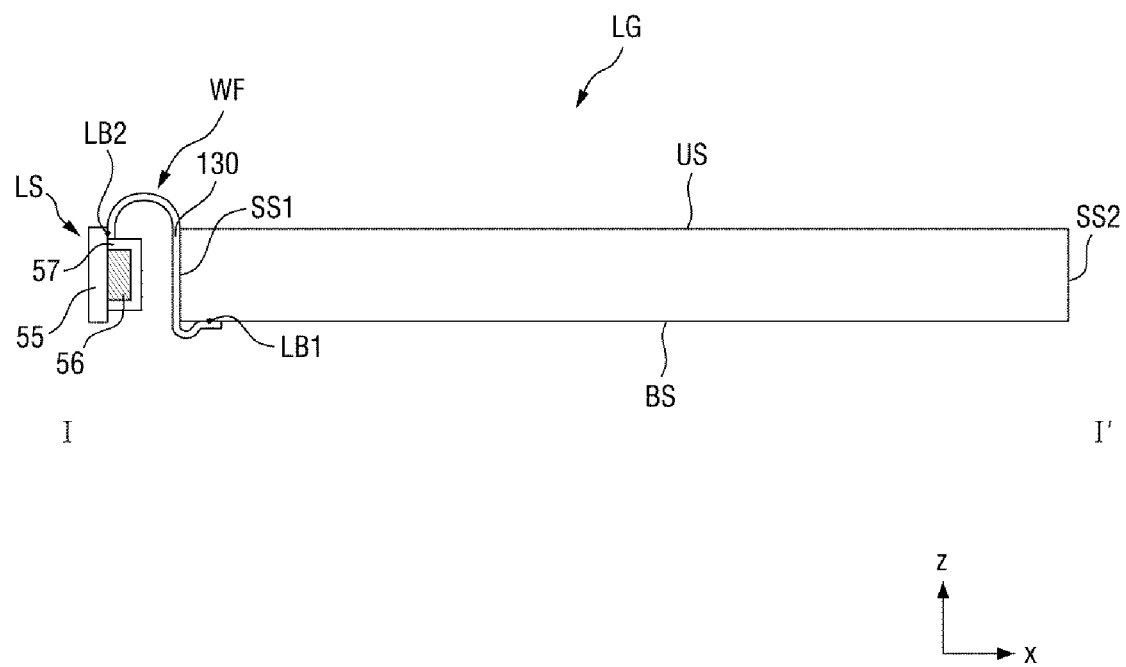
FIG. 10 is a cross-sectional view of another exemplary embodiment of a backlight unit according to the invention.

FIG. 10 is a cross-sectional view of another exemplary embodiment of a backlight unit according to the invention.

The backlight unit shown in FIG. 10 is different from the backlight unit shown in FIG. 2 in that the wavelength-converting film WF is in contact with the light guide plate LG.

In an exemplary embodiment, the central portion 130 of the wavelength-converting film WF may be at least partly in contact with the first side surface SS1 of the light guide plate LG.

That is, the second air gap AG2 in the exemplary embodiment described above with reference to FIG. 2 may not be formed in this exemplary embodiment.

However, the first air gap AG1 may be formed between the light source LS and the wavelength-converting film WF as illustrated in FIG. 10. The structure and shape of the first air gap AG1 may be substantially the same as those described above with reference to FIG. 2.

When the wavelength-converting film WF and the first side surface SS1 are in contact with each other, the distance between the light source LS and the light guide plate LG can be shortened. As a result, the overall width of the backlight unit can be reduced.

Figure 11:
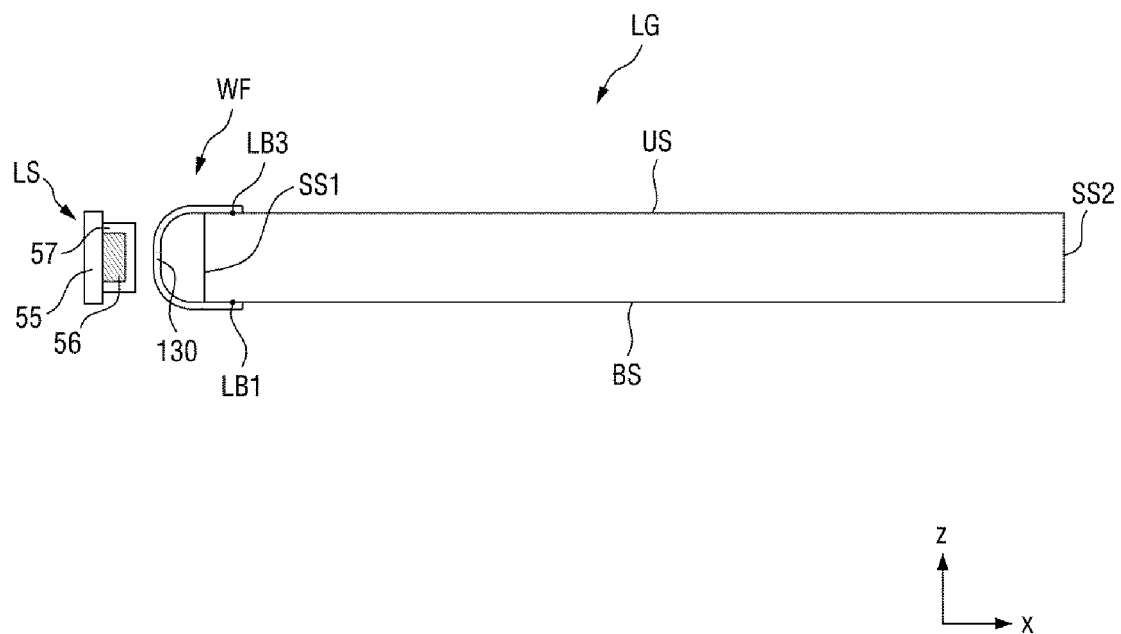
FIG. 11 is a cross-sectional view of still another exemplary embodiment of a backlight unit according to the invention.

FIG. 11 is a cross-sectional view of still another exemplary embodiment of a backlight unit according to the invention.

Referring to FIG. 11, in an exemplary embodiment, the first connecting portion 110 as well as the second connecting portion 120 of the wavelength-converting film WF may be connected to the light guide plate LG.

In an exemplary embodiment, the first connecting portion 110 may be connected to the lower surface BS of the light guide plate LG, and the second connecting portion 120 may be connected to the upper surface US of the light guide plate LG. In other words, the first connecting portion 110 may be bonded to the lower surface BS of the light guide plate LG, and the second connecting portion 120 may be bonded to the upper surface US of the light guide plate LG.

In the exemplary embodiment, a third laser-bonding portion LB3 may be formed between the second connecting portion 120 and the upper surface US of the light guide plate LG. The shape of the third laser-bonding portion LB3 may be substantially identical to that of the second laser-bonding portion LB2 described above.

Also in this exemplary embodiment, the central portion 130 may be disposed between the light source LS and the light guide plate LG, that is, on the optical path described above.

Figure 12:
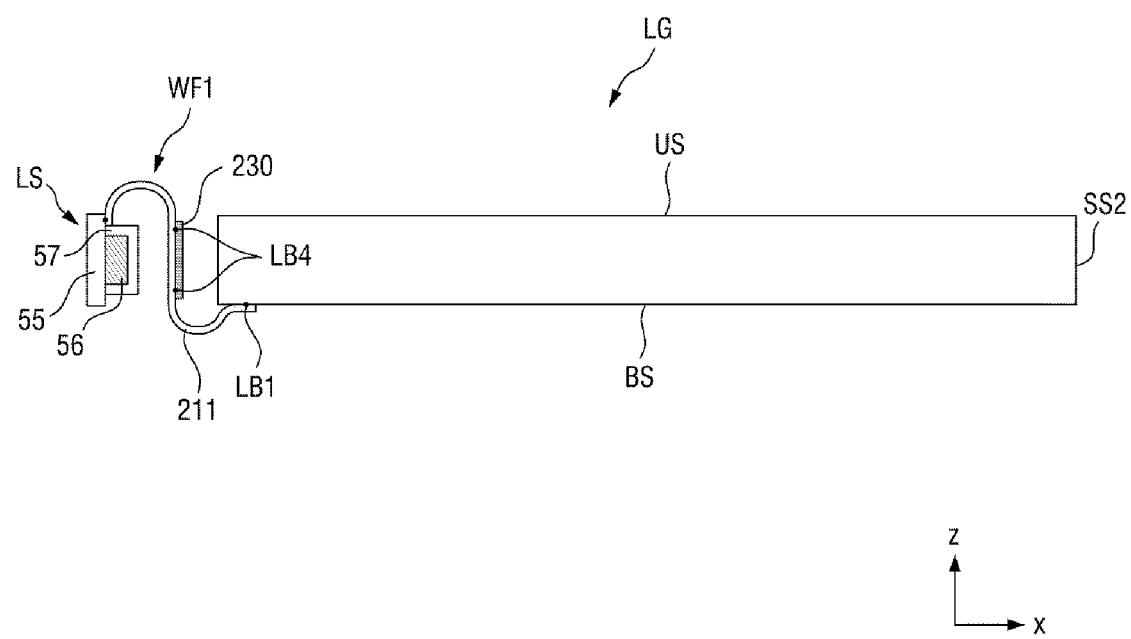
FIG. 12 is a cross-sectional view of yet another exemplary embodiment of a backlight unit according to the invention.
Figure 13:
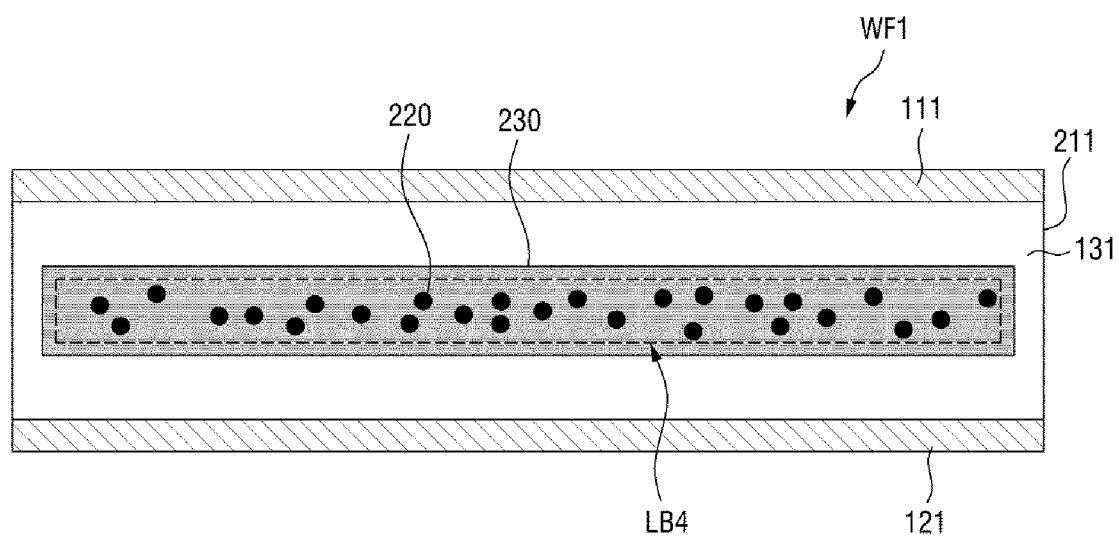
FIG. 13 is a top plan view of an exemplary embodiment of a wavelength-converting film of the backlight unit shown in FIG. 12.

FIG. 12 is a cross-sectional view of yet another exemplary embodiment of a backlight unit according to the invention. FIG. 13 is a plan view of some elements of the exemplary embodiment shown in FIG. 12.

Referring to FIGS. 12 and 13, in another exemplary embodiment, a wavelength-converting film WF1 may include a flexible glass film 211, a base glass 230, and a wavelength-converting particle 220 provided in plurality.

The flexible glass film 211 includes or is made of glass and may be made relatively thin so that it is flexible.

In an exemplary embodiment, the thickness of the flexible glass film 211 may range from about 0.1 mm to about 0.5 mm.

Like the exemplary embodiment shown in FIG. 4, a first connecting portion 111, a second connecting portion 121, and a central portion 131 between the first connecting portion 111 and the second connecting portion 121 may be defined within the flexible glass film 211.

The base glass 230 may be disposed on a surface of the flexible glass film 210. The base glass 230 includes or is made of glass and may be disposed at the center portion 131 of the wavelength-converting film WF1.

That is, the base glass 230 may be disposed between the light source LS and the first side surface SS1 as shown in FIG. 12. In other words, the base glass 230 may be disposed on the optical path described above. That is, the light emitted from the light source LS may pass through the base glass 230 to reach the first side surface SS1.

A plurality of wavelength-converting particles 220 may be disposed in the base glass 230. The wavelength-converting particles 220 may be substantially identical to those described above with reference to FIG. 3.

In an exemplary embodiment, the base glass 230 may be laser bonded to the flexible glass film 211.

That is, a fourth laser-bonding portion LB4 may be formed between the base glass 230 and the flexible glass film 211.

In an exemplary embodiment, the fourth laser-bonding portion LB4 may be disposed on an inner side of the periphery of the base glass 230 and may be extended along a length thereof (see FIG. 13). An outer side of the base glass 230 may face the first side surface SS1 of the light guide plate LG.

In an exemplary embodiment, the fourth laser-bonding portion LB4 may include at least one discrete bonding dot and/or a continuous bonding line.

In an exemplary embodiment, the first connecting portion 111 may be connected to the light guide plate LG. Specifically, the first connecting portion 111 may be bonded to the lower surface BS of the light guide plate LG. Accordingly, a first laser-bonding portion LB1 may be formed between the first connecting portion 111 and the lower surface BS of the light guide plate LG, as described above.

The second connecting portion 121 may be connected to the light source LS. Specifically, the second connecting portion 121 may be connected to the printed circuit board 55 of the light source LS.

Accordingly, the second laser-bonding portion LB2 may be formed between the printed circuit board 55 and the second connecting portion 121 as described above with reference to FIG. 2 or the like.

Figure 14:
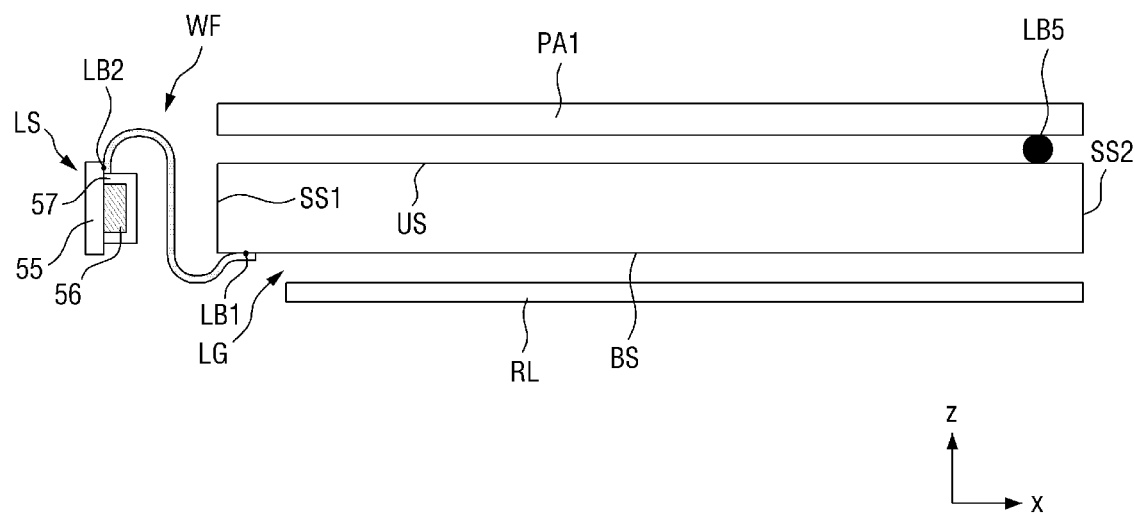
FIG. 14 is a cross-sectional view of an exemplary embodiment of a display device according to the invention.

FIG. 14 is a cross-sectional view of an exemplary embodiment of a display device including a backlight unit according to the invention.

Referring to FIG. 14, a display device according to an exemplary embodiment of the present disclosure may include a backlight unit and a display panel PA1 disposed on the backlight unit.

The backlight unit may be substantially identical to any of those described above with reference to some exemplary embodiments of the present disclosure.

The display panel PA1 may be disposed on the backlight unit. The display panel PA1 displays images with light provided from the backlight unit.

In an exemplary embodiment, the display panel PA1 may include a glass (base) substrate. In the exemplary embodiment in which the display panel PA1 includes a glass substrate, the display panel PA1 may be bonded to the light guide plate LG. That is, a fifth laser-bonding portion LB5 may be formed between the display panel PA1 and the upper surface of the light guide plate LG.

The fifth laser-bonding portion LB5 may include a plurality of discrete bonding dots and/or a continuous bonding line. The position of the fifth laser-bonding portion LB5 shown in FIG. 14 is merely illustrative and not restrictive.

The display device according to an exemplary embodiment of the present disclosure may further include a reflective layer RL.

The reflective layer RL may be disposed under the light guide plate LG. The reflective layer RL may serve to reflect the light which exits from the lower surface BS of the light guide plate LG back into the light guide plate LG toward the upper surface US. The reflective layer RL may perform mirror reflection and/or diffuse reflection.

In an exemplary embodiment, the reflective layer RL may be in the form of a sheet. Further, a pattern of functional features may be formed on the reflective layer RL.

Figure 15:
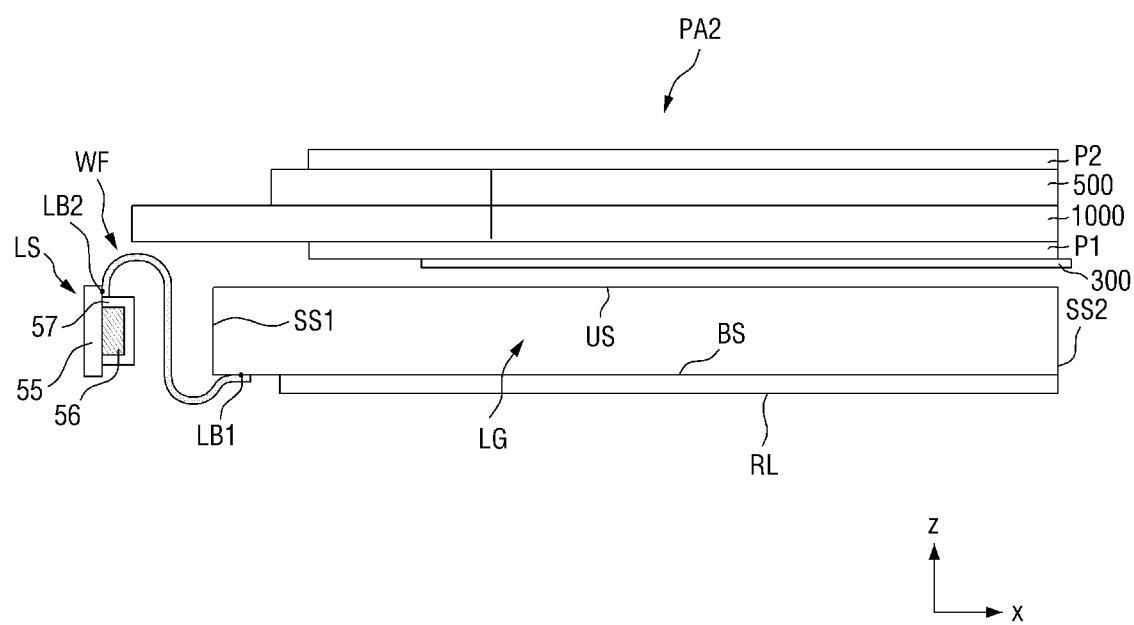
FIG. 15 is a cross-sectional view of another exemplary embodiment of a display device including a backlight unit according to the invention.

FIG. 15 is a cross-sectional view of another exemplary embodiment of a display device according to the invention.

Referring to FIG. 15, a display panel PA2 may include a first (display) substrate 1000, a second (display) substrate 500 facing the first substrate 1000, and an optical transmittance layer such as a liquid-crystal layer (not shown) disposed between the first substrate 1000 and the second substrate 500.

In an exemplary embodiment, the first substrate 1000 may be an array substrate in which transistors are formed such as on a base substrate thereof, and the second substrate 500 may be a color filter substrate in which color filters are formed such as on a base substrate thereof.

In another exemplary embodiment, color filters may be formed in and/or on the first substrate 1000. That is, the display panel PA2 may be a display panel having a color filter on array ("COA") structure.

In an exemplary embodiment, the first substrate 1000 and/or the second substrate 500 may include or be made of glass.

In an exemplary embodiment, at least a part of the first substrate 1000 may overlap with the second substrate 500, such as a portion of the first substrate 1000 is exposed outside the second substrate 500. A driver (not shown) and a printed circuit board (not shown) may be disposed on the exposed portion of the first substrate 1000 that does not overlap with the second substrate 500.

In an exemplary embodiment, the first substrate 1000 may be larger than the second substrate 500 in a top plan view (e.g., view of plane defined in the x-axis and y-axis directions). It is, however, to be understood that this is merely illustrative. In other exemplary embodiments, the second substrate 500 may be larger than the first substrate 1000.

In an exemplary embodiment, the display device according to an exemplary embodiment of the present disclosure may further include a first polarizing plate P1, a second polarizing plate P2, and an optical sheet 300.

The first polarizing plate P1 and the second polarizing plate P2 may be disposed on the outer sides of the display panel PA2, respectively.

The first polarizing plate P1 and the second polarizing plate P2 may transmit only some of the incident light that oscillates in a particular direction and block or reflect a remainder of the incident light.

In an exemplary embodiment, the polarization direction of the first polarizing plate P1 may be different from that of the second polarizing plate P2.

In an exemplary embodiment, the first polarizing plate P1 and the second polarizing plate P2 may be disposed inside the display panel PA2, instead of outside the display panel PA2 as shown in FIG. 15. Then, the first polarizing plate P1 and the second polarizing plate P2 disposed inside the display panel PA2 may be in-cell polarizing plates.

Further, in an exemplary embodiment, the first polarizing plate P1 and/or the second polarizing plate P2 may include a wire grid polarizer ("WGP").

Hereinafter, a method for manufacturing a display device according to some exemplary embodiments of the present disclosure will be described. Some of elements described below may be identical to those of the liquid-crystal display described above with respect to the some exemplary embodiments of the present disclosure; and, therefore, description thereof may be omitted to avoid redundancy.

Figure 16:
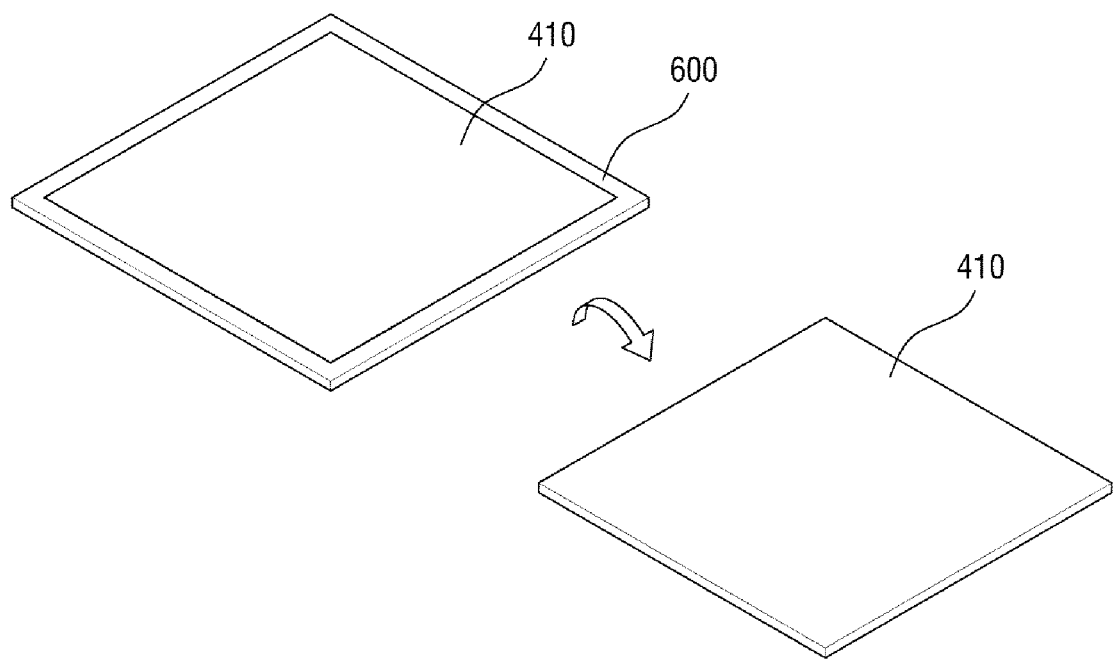
FIG. 16 is a perspective view illustrating an exemplary embodiment of a method of manufacturing a display device including a backlight unit according to the invention.
Figure 17:
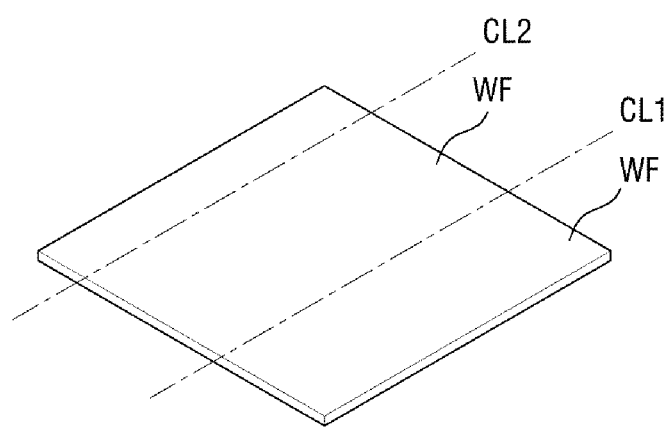
FIG. 17 is a perspective view illustrating a method of manufacturing a display device according to an exemplary embodiment of the present disclosure.

FIGS. 16 and 17 are perspective views for illustrating an exemplary embodiment of a method for manufacturing a display device including a backlight unit according to the invention.

A method for manufacturing a display device according to an exemplary embodiment of the present disclosure may include combining glass frit with wavelength-converting particles to form a combination 410 of glass frit and wavelength-converting particles; pouring the combination 410 of glass frit and wavelength-converting particles into a mold 600 to the combination 41-00; cutting the sintered combination 410 into wavelength-converting films WF; and connecting a part of the wavelength-converting film WF to the light guide plate LG and disposing the remaining part of the wavelength-converting film between the light source LS and the light guide plate LG.

The method includes forming a combination 410 of glass frit and wavelength-converting particles. The forming the combination 410 may be performed by pouring the glass frit and wavelength-converting particles into a batch reactor and combining them.

The wavelength-converting particles may be a quantum dot material or a phosphor material as described above with reference to FIG. 2.

At this time, the combination 410 of glass frit and wavelength-converting particles may be in a liquid phase.

Referring to the left view of FIG. 16, the method may include pouring the combination 410 into a mold 600 and sintering the combination 410. The mold 600 may include a seating space which forms the combination 410 in the shape of a film having a relatively small thickness.

Once the combination 410 is sintered, it may be removed from the mold 600. The removed combination 410 may have a thin film shape as shown in the right view of FIG. 16.

Referring to FIG. 17, the method may include cutting the sintered (thin film shape) combination 410 into plural wavelength-converting films WF.

The combination 410 in the form of a film may be cut into the wavelength-converting films WF having a desired size. FIG. 17 shows an example in which the combination of glass frit and wavelength-converting particles 410 is cut along a first cutting line CL1 and a second cutting line CL2.

In an exemplary embodiment, the combination of glass frit and wavelength-converting particles 410 may be cut by a laser cutting method or a mechanical scribing method. It is to be understood that a laser cutting method and a mechanical scribing method are merely illustrative.

The method may include connecting a part of the wavelength-converting film WF to the light guide plate LG, and disposing the remaining part of the wavelength-converting film WF between the light source LS and the light guide plate LG.

By connecting a part of the wavelength-converting film WF to the light guide plate LG and disposing the remaining part of the wavelength-converting film WF between the light source LS and the light guide plate LG, the backlight unit according to the above-described exemplary embodiments can be obtained.

That is, the first connecting portion 110 of the wavelength-converting film WF may be connected to the lower surface BS of the light guide plate LG, and the central portion 130 may be disposed between the first side surface SS1 of the light guide plate LG and the light source LS.

The second connecting portion 120 may be connected to the printed circuit board 55 or the upper surface US of the light guide plate LGP (see FIG. 2 or FIG. 11).

Although embodiments of the invention have been disclosed for illustrative purposes, those skilled in the art will appreciate that various modifications, additions and substitutions are possible, without departing from the scope and spirit of the invention as disclosed in the accompanying claims.

While the invention has been particularly illustrated and described with reference to exemplary embodiments thereof, it will be understood by those of ordinary skill in the art that various changes in form and detail may be made therein without departing from the spirit and scope of the invention as defined by the following claims. The exemplary embodiments should be considered in a descriptive sense only and not for purposes of limitation.

What is claimed is:

1. A backlight unit comprising:
a light guide plate through which light is provided to a display panel which displays an image with the light;
a light source which emits the light to the light guide plate, the light source disposed facing a light incident side surface of the light guide plate; and
a wavelength-converting film comprising:
a first end portion thereof connected to the light guide plate, and
a central portion thereof disposed between the light source and the light incident side surface of the light guide plate, and through which emitted light from the light source is wavelength-converted and provided to the light incident side surface of the light guide plate,
wherein the wavelength-converting film comprises a composition of glass and wavelength-converting particles which are dispersed in the glass.

2. The backlight unit of claim 1, wherein
the wavelength-converting film comprises a flexible glass film, and
the wavelength-converting particles are dispersed in the flexible glass film.

3. The backlight unit of claim 2, wherein a thickness of the flexible glass film ranges from about 0.1 millimeter to about 0.5 millimeter.

4. The backlight unit of claim 1, further comprising:
a first air gap disposed between the light source and the central portion of the wavelength-converting film.

5. The backlight unit of claim 4, wherein
the light source and the central portion of the wavelength-converting film are spaced apart from each other in a first direction, and
a width of the first air gap along the first direction ranges from about 0.1 millimeter to about 0.2 millimeter.

6. The backlight unit of claim 1, further comprising:
a second air gap disposed between the light guide plate and the central portion of the wavelength-converting film.

7. The backlight unit of claim 1, wherein the wavelength-converting film further comprises a second end portion opposing the first end portion thereof.

8. The backlight unit of claim 7, wherein the second end portion of the wavelength-converting film which opposes the first end portion thereof is connected to the light source.

9. The backlight unit of claim 8, wherein
the light source comprises a printed circuit board on which a light-generating member is disposed, and
the second end portion of the wavelength-converting film is bonded to the printed circuit board.

10. The backlight unit of claim 7, wherein
the light guide plate comprises an upper surface through which the light is emitted to the display panel, and a lower surface which faces the upper surface,
the first end portion of the wavelength-converting film is connected to the lower surface of the light guide plate, and
the second end portion of the wavelength-converting film is connected to the upper surface of the light guide plate.

11. The backlight unit of claim 1, wherein the wavelength-converting particles comprise a quantum dot material.

12. The backlight unit of claim 1, wherein
the wavelength-converting film comprises a flexible glass film and a base glass which is disposed on the flexible glass film,
the base glass is disposed between the flexible glass film and the light incident surface of the light guide plate, and
the wavelength-converting particles are dispersed in the base glass.

13. The backlight unit of claim 1, wherein
the light guide plate comprises an upper surface through which the light is emitted to the display panel, and a lower surface opposite to the upper surface,
the first end portion of the wavelength-converting film and the lower surface of the light guide plate are laser-bonded to each other by a first laser-bonding portion between the first end portion of the wavelength-converting film and the lower surface of the light guide plate,
the first laser-bonding portion includes a first bonding dot,
the first bonding dot includes a central area and a peripheral area surrounding the central area, and
a cross sectional shape of the central area of the first bonding dot is an elliptical shape or a circular shape.

14. A display device comprising:
a display panel which displays an image with light; and
a backlight unit which provides the light to the display panel,
wherein the backlight unit comprises:
a light guide plate through which the light is provided to the display panel;
a light source which emits the light to the light guide plate, the light source disposed facing a light incident side surface of the light guide plate; and
a wavelength-converting film comprising:
a first end portion thereof connected to the light guide plate, and
a central portion thereof disposed between the light source and the light incident side surface of the light guide plate, and through which emitted light from the light source is wavelength-converted and provided to the light incident side surface of the light guide plate,
wherein the wavelength-converting film comprises a composition of glass and wavelength-converting particles which are dispersed in the glass.

15. The display device of claim 14, wherein
the wavelength-converting film comprises a flexible glass film, and
the wavelength-converting particles are dispersed in the flexible glass film.

16. The display device of claim 14, further comprising:
a first air gap disposed between the light source and the central portion of the wavelength-converting film.

17. The display device of claim 14, wherein the wavelength-converting particles comprise a quantum dot material.

18. The display device of claim 14, wherein
the wavelength-converting film comprises a flexible glass film and a base glass which is disposed on the flexible glass film, the base glass is disposed between the flexible glass film and the light incident surface of the light guide plate, and the wavelength-converting particles are dispersed in the base glass.

19. The display device of claim 14, wherein the light guide plate further comprises an upper surface which faces the display panel, and a lower surface opposite to the upper surface, the first end portion of the wavelength-converting film and the lower surface of the light guide plate are laser-bonded to each other by a first laser-bonding portion between the first end portion of the wavelength-converting film and the lower surface of the light guide plate, the first laser-bonding portion includes a first bonding dot, the first bonding dot includes a central area and a peripheral area surrounding the central area, and a cross sectional shape of the central area of the first bonding dot is an elliptical shape or a circular shape.

20. A method for manufacturing a display device, the method comprising:

combining glass frit with wavelength-converting particles to form a combination of glass frit and wavelength-converting particles;

disposing the combination of glass frit and wavelength-converting particles into a mold in which the combination of glass frit and wavelength-converting particles is sintered;

separating a portion of the sintered combination into a wavelength-converting film of a backlight unit of the display device, the wavelength-converting film comprising a composition of glass and the wavelength-converting particles which are dispersed in the glass;

connecting a first end portion of the wavelength-converting film to a lower surface of a light guide plate of the backlight unit using a femtosecond laser having a wavelength in femtosecond, wherein the light guide plate guides light therethrough to a display panel of the display device which displays an image with the light; and disposing a portion of the wavelength-converting film which includes the wavelength-converting particles and is adjacent to the first end portion thereof, between the light guide plate and a light source of the backlight unit, wherein the light source emits the light to a light incident surface of the light guide plate.

* * * * *